United States Patent
Liu et al.

(10) Patent No.: US 7,118,979 B2
(45) Date of Patent: Oct. 10, 2006

(54) METHOD OF MANUFACTURING TRANSISTOR HAVING GERMANIUM IMPLANT REGION ON THE SIDEWALLS OF THE POLYSILICON GATE ELECTRODE

(75) Inventors: Kaiping Liu, Plano, TX (US); Zhiqiang Wu, Plano, TX (US); Majid Movahed Mansoorz, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 3 days.

(21) Appl. No.: 10/701,818

(22) Filed: Nov. 5, 2003

(65) Prior Publication Data

US 2005/0093032 A1   May 5, 2005

(51) Int. Cl.
*H01L 21/336* (2006.01)
*H01L 29/78* (2006.01)
(52) U.S. Cl. .............. 438/302; 438/305; 438/520; 438/528
(58) Field of Classification Search ............ 438/197, 438/199, 229–232, 299, 302, 514, 520, 527, 438/528, 305; 257/344
See application file for complete search history.

(56) References Cited

U.S. PATENT DOCUMENTS 5,970,353 A * 10/1999 Sultan ................. 438/302
6,037,204 A * 3/2000 Chang et al. .......... 438/231
6,229,177 B1 * 5/2001 Yeap et al. ........... 257/327
6,361,874 B1 * 3/2002 Yu ...................... 428/514
6,528,399 B1 * 3/2003 Alieu et al. .......... 438/561
6,682,980 B1 * 1/2004 Chidambaram et al. .... 438/302
6,699,771 B1 * 3/2004 Robertson ............ 438/420

OTHER PUBLICATIONS

K.K. Ng et al. Suppression of Hot-Carrier Degradation in Si MOSFET's by Germanium Doping. IEEE 1990, pp. 45-47.*
K. H. Kwok et al. Boron Diffusion in High-Dose Germanium-Implanted Silicon. IEEE 1998, pp. 878-881.*

* cited by examiner

*Primary Examiner*—Anh Duy Mai
(74) *Attorney, Agent, or Firm*—Peter K. McLarty; W. James Brady, III; Frederick J. Telecky, Jr.

(57) ABSTRACT

The present invention provides a transistor 100 having a germanium implant region 170 located therein, a method of manufacture therefor, and an integrated circuit including the aforementioned transistor. The transistor 100, in one embodiment, includes a polysilicon gate electrode 140 located over a semiconductor substrate 110, wherein a sidewall of the polysilicon gate electrode 140 has a germanium implanted region 170 located therein. The transistor 100 further includes source/drain regions 160 located within the semiconductor substrate 110 proximate the polysilicon gate electrode 140.

12 Claims, 9 Drawing Sheets

METHOD OF MANUFACTURING TRANSISTOR HAVING GERMANIUM IMPLANT REGION ON THE SIDEWALLS OF THE POLYSILICON GATE ELECTRODE

TECHNICAL FIELD OF THE INVENTION

The present invention is directed, in general, to a semiconductor device and, more specifically, to a transistor having a germanium implant region located therein and a method of manufacture therefor.

BACKGROUND OF THE INVENTION

As the geometries of semiconductor devices and particularly MOS transistors are being scaled to continually smaller dimensions, there is a desire for shorter gate lengths. However, as the transistor gate lengths continue to shrink the effects of p-poly sidewall depletion on PMOS transistor performance has become problematic.

It is believed that the problems are due, in part, to a larger portion of the polysilicon gate depletion being controlled by the edge depletion. This reduces the effective gate length of the device without reducing the physical gate length of the device, which in turn causes a higher concentration of a halo or pocket implant to be used. Unfortunately, as a higher concentration of the halo or pocket implant is used, the edge depletion region of the polysilicon gate electrode again increases, which further causes an even higher concentration of the halo or pocket implant to be used.

The increased edge depletion region is believed to be a function of the P-type dopant from the polysilicon gate electrode segregating from the sidewall of the polysilicon gate electrode, while the N-type dopant from the halo or pocket implant piling up at the sidewall of the polysilicon gate electrode. What results is an insufficient net P-type doping at the sidewalls of the polysilicon gate electrode, and thus a reduction in the effective gate length of the polysilicon gate electrode. This is not only a cyclical problem that feeds itself, but the carrier injection efficiency of the transistor is substantially degraded as a result of the increasingly higher halo or pocket implant concentrations.

The industry has addressed this problem using a number of different techniques. Most notably, the industry attempted to change from using P-type doped polysilicon gate electrodes to P-type doped silicon germanium gate electrodes. While the P-type doped silicon germanium gate electrodes substantially reduce the issues of the gate sidewall depletion, they are currently incompatible with NMOS devices. Accordingly, the industry would be forced to use polysilicon gate electrodes for the NMOS devices while using the silicon germanium gate electrodes for the PMOS devices, which is unreasonable.

Accordingly, what is needed in the art is a polysilicon gate electrode and method of manufacture therefor that does not experience the sidewall depletion issues experienced by the prior art devices.

SUMMARY OF THE INVENTION

To address the above-discussed deficiencies of the prior art, the present invention provides a transistor having a germanium implant region located therein, a method of manufacture therefor, and an integrated circuit including the aforementioned transistor. The transistor, in one embodiment, includes a polysilicon gate electrode located over a semiconductor substrate, wherein a sidewall of the polysilicon gate electrode has a germanium implanted region located therein. The transistor further includes source/drain regions located within the semiconductor substrate proximate the polysilicon gate electrode.

As previously discussed, the present invention further provides a method of manufacturing the transistor. Among other processing steps, the method includes forming a polysilicon gate electrode over a semiconductor substrate, then implanting a sidewall of the polysilicon gate electrode with germanium, thereby forming a germanium implanted region. The method further includes placing source/drain regions within the semiconductor substrate proximate the polysilicon gate electrode.

Further included within the present invention is an integrated circuit including the aforementioned transistors. In addition to the transistors, the integrated circuit includes an interlevel dielectric layer located over the transistors, the interlevel dielectric layer having interconnects located therein for contacting the transistors to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
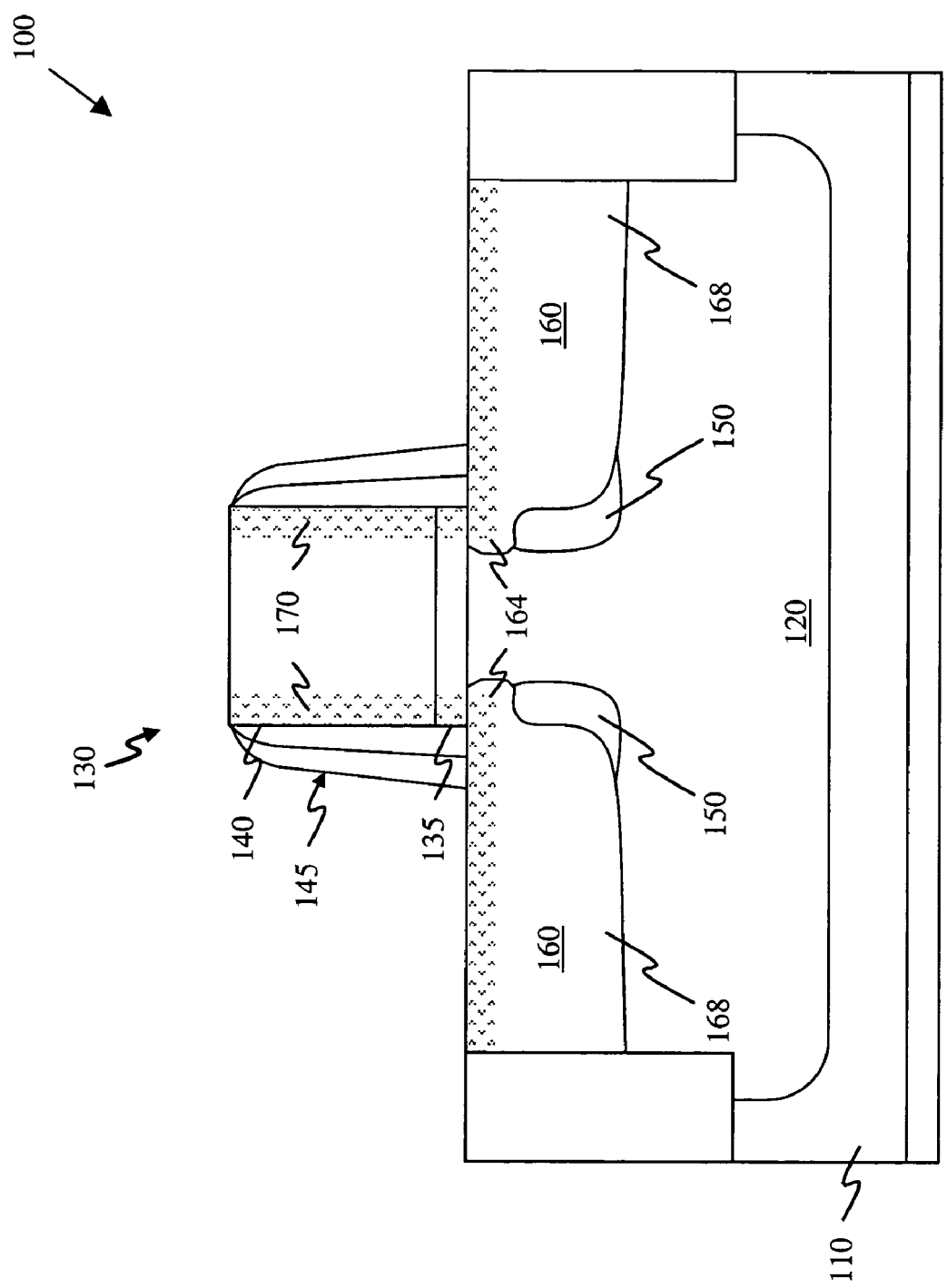
FIG. 1 illustrates a cross-sectional view of one embodiment of a transistor device constructed according to the principles of the present invention.

Referring initially to FIG. 1, illustrated is a cross-sectional view of one embodiment of a transistor device 100 constructed according to the principles of the present invention. In the embodiment illustrated in FIG. 1, the transistor device 100 includes a substrate 110. Located within the substrate 110 in the embodiment of FIG. 1 is a well region 120. Additionally, located over the substrate 110 and well region 120 is a gate structure 130.

The gate structure 130 illustrated in FIG. 1 includes a gate oxide 135 located over the substrate 110, as well as a polysilicon gate electrode 140 located over the gate oxide 135. Flanking both sides of the polysilicon gate electrode 140 and gate oxide 135 of the gate structure 130 depicted in FIG. 1 are gate sidewall spacers 145.

The transistor device 100 illustrated in FIG. 1 further includes halo implants 150 and conventional source/drain regions 160 located within the substrate 110. The source/drain regions 160, as is common, each include a lightly doped source/drain implant 164 as well as a higher doped source/drain implant 168.

Uniquely implanted into at least a portion of the sidewalls of the polysilicon gate electrode 140, in the exemplary embodiment of FIG. 1, are germanium implanted regions 170. Germanium implant regions 170 constructed in accordance with the principles of the present invention may have a variety of dopant concentrations and thicknesses while staying within the broad scope of the present invention. It is believed that germanium implant region 170 dopant concentrations ranging from about 2E21 atoms/cm$^3$ to about 8E21 atoms/cm$^3$ are applicable. Additionally, it is believed that germanium implant region 170 thicknesses ranging from about 2 nm to about 15 nm, as well as others, could easily be used.

It should be noted that the thickness of the germanium implant regions 170 should generally be less than a distance that each of the lightly doped source/drain implants 164 extends under the polysilicon gate electrode 140. For example, where each of the lightly doped source/drain implants 164 extends under the polysilicon gate electrode 140 by a distance X (e.g., 7 nm), the thickness of each of the germanium implant regions 170 should be less than X (e.g., less than 7 nm). If the thickness of the germanium implant regions 170 is larger than the overlap of the lightly doped source/drain implants 164, germanium may be located in the channel region of the transistor 100, thus potentially causing scattering on the hole carriers and mobility degradation. Nevertheless, if the thickness of the germanium implant regions 170 are too thin, they will not be able to retain a sufficient amount of the P-type dopant at the sidewalls of the polysilicon gate electrode 140.

In the particular embodiment illustrated in FIG. 1, the germanium implant regions 170 also extend into an upper region of the source/drain regions 160. For example, in one embodiment the germanium implant regions 170 extend into the source/drain regions 160 from about 4 nm to about 10 nm. Additionally, as shown, the germanium implant regions 170 may extend into the sidewalls of the gate oxide 135. Nonetheless, while the germanium implant regions 170 are shown to be located within the sidewalls of the gate oxide 135 and the upper region of the source/drain regions 160, such is not required, and germanium implant regions 170 localized only in the sidewalls of the polysilicon gate electrode 140 are also desirable.

The use of the germanium implant regions 170 in accordance with the principles of the present invention provide many advantages not experienced in the prior art devices. For example, the inclusion of the germanium dopant at the P-type doped polysilicon gate electrode 140 sidewall increases the dopant activation therein, substantially reduces the P-type dopant segregation into the P-type doped polysilicon gate electrode 140 sidewall, and substantially increases the N-type halo dopant segregation into the P-type doped polysilicon gate electrode 140 sidewall.

Additionally, the inclusion of the germanium implant regions 170 in the substrate 110 provides certain benefits. First, a high germanium concentration in the lightly doped source/drain region 164 is capable of increasing the P-type dopant activation level by up to one order of magnitude. As a result, lower lightly doped source/drain region 164 resistance can be achieved. Second, a strained layer is formed as a result of the germanium being in the substrate 110. This strained layer may induce longitudinal stress inside the transistor channel, thus improving the channel mobility. Additionally, the lower lightly doped source/drain region 164 resistance and higher channel mobility may each improve transistor drive current. While it was not previously noted, those skilled in the art understand that the inventive aspects of the present invention are applicable to all kinds of wafer types, including different wafer orientations encompassing silicon-on-insulator (SOI), and other similar wafer orientations.

The use of germanium in the substrate 110 should, however, be tailored to the specific application. For example, if the germanium is implanted too deep into the substrate 110, defects produced during solid-phase epitaxy may cause LDD-to-substrate leakage. Secondly, if too much germanium dopant spills over into the channel during formation of the germanium implanted regions 170, then the germanium dopant may cause alloy-scattering during hole carrier conduction, or mobility degradation.

Figure 2:
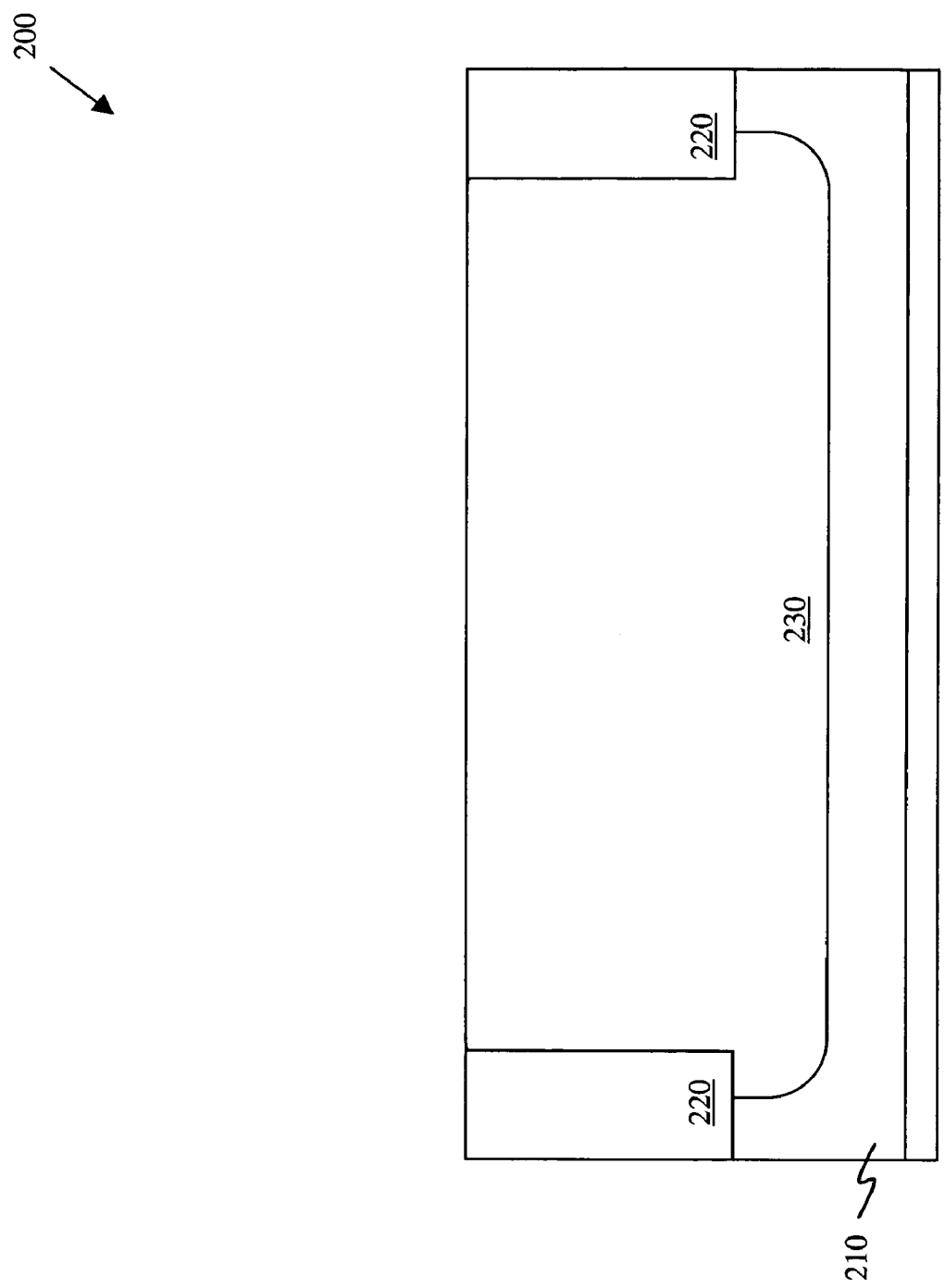
FIG. 2 illustrates a cross-sectional view of a partially completed transistor device.

Turning now to FIGS. 2–7, illustrated are cross-sectional views of detailed manufacturing steps instructing how one might, in an advantageous embodiment, manufacture a transistor device similar to the transistor device 100 depicted in FIG. 1. FIG. 2 illustrates a cross-sectional view of a partially completed transistor device 200. The partially completed transistor device 200 of FIG. 2 includes a substrate 210. The substrate 210 may, in an exemplary embodiment, be any layer located in the partially completed transistor device 200, including a wafer itself or a layer located above the wafer (e.g., epitaxial layer). In the embodiment illustrated in FIG. 2, the substrate 210 is a P-type semiconductor substrate; however, one skilled in the art understands that the substrate 210 could be an N-type substrate without departing from the scope of the present invention. In such a case, each of the dopant types described throughout the remainder of this document would be reversed. For clarity, no further reference to this opposite scheme will be discussed.

Located within the substrate 210 in the embodiment shown in FIG. 2 are shallow trench isolation regions 220.

The shallow trench isolation regions 220 isolate the transistor device 200 from other devices located proximate thereto. As those skilled in the art understand the various steps used to form these conventional shallow trench isolation regions 220, no further detail will be given.

In the illustrative embodiment of FIG. 2, also formed within the substrate 210 is a well region 230. The well region 230, in light of the P-type semiconductor substrate 210, would more than likely contain an N-type dopant. For example, the well region 230 would likely be doped with an N-type dopant dose ranging from about 1E13 atoms/cm$^2$ to about 1E14 atoms/cm$^2$ and at a power ranging from about 100 keV to about 500 keV. What generally results is the well region 230 having a peak dopant concentration ranging from about 5E17 atoms/cm$^3$ to about 1E19 atoms/cm$^3$.

Figure 3:
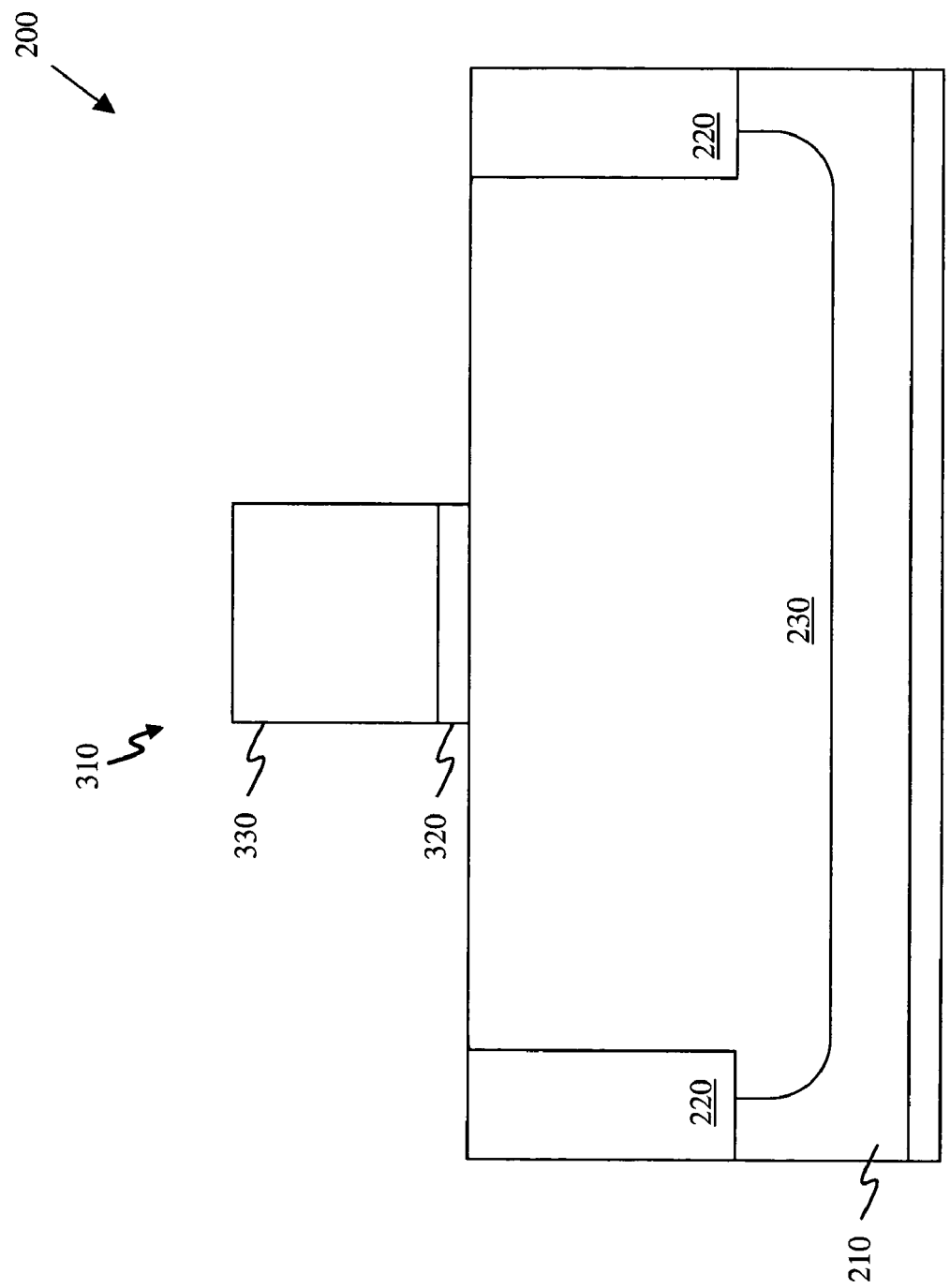
FIG. 3 illustrates a cross-sectional view of the partially completed transistor device illustrated in FIG. 2 after formation of a conventional gate structure over the substrate.

Turning now to FIG. 3, illustrated is a cross-sectional view of the partially completed transistor device 200 illustrated in FIG. 2 after formation of a conventional gate structure 310 over the substrate 210. As is illustrated in FIG. 3, the gate structure 310 includes a gate oxide 320 and a polysilicon gate electrode 330. As the gate structure 310 is conventional, those skilled in the art understand the standard steps used for its manufacture, including blanket depositing both a gate oxide layer and a polysilicon gate electrode layer and subsequently using photolithography to define the gate structure 310.

Figure 4:
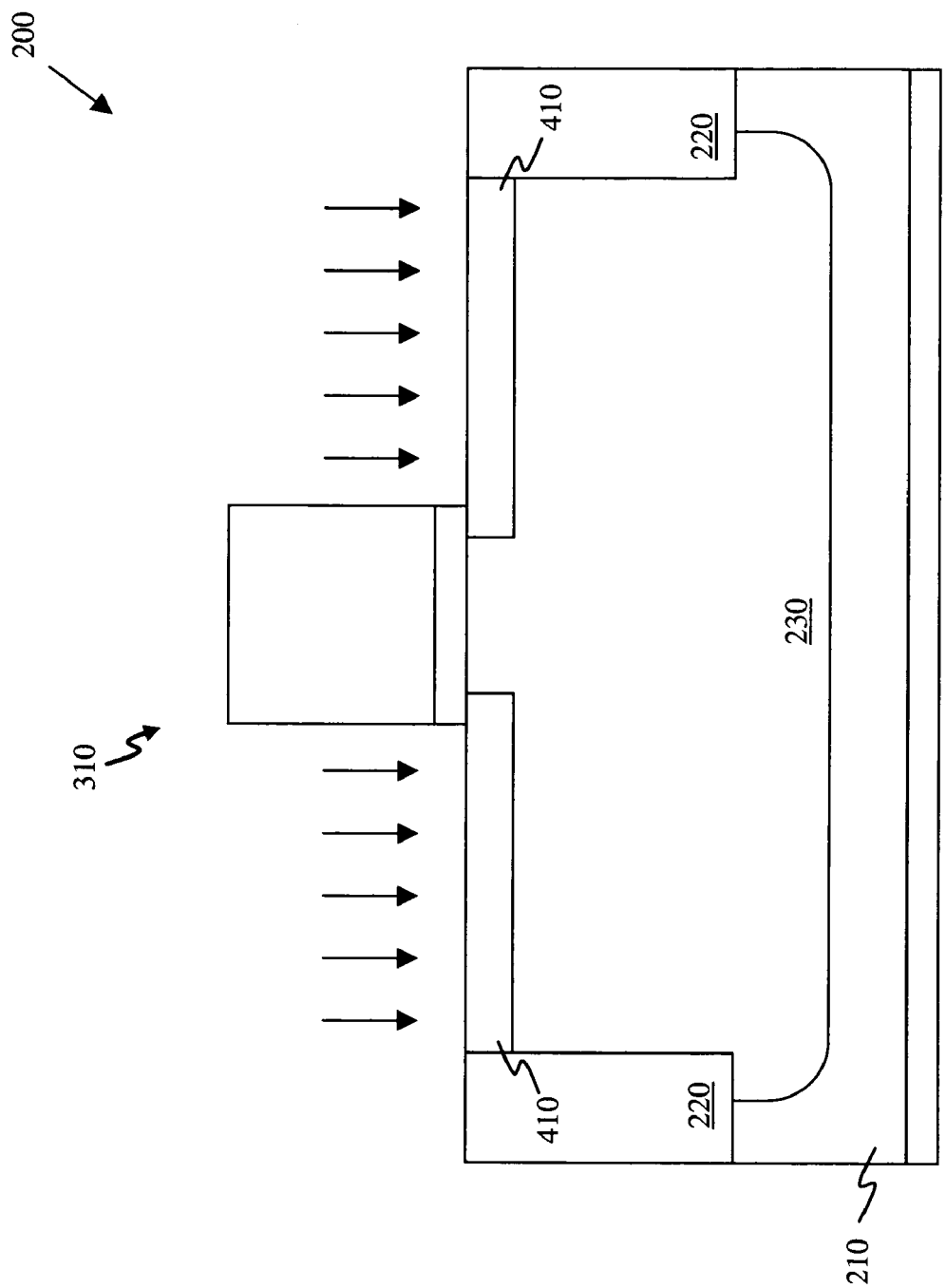
FIG. 4 illustrates a cross-sectional view of the partially completed transistor device illustrated in FIG. 3 after formation of lightly doped source/drain implants within the substrate.

Turning now to FIG. 4, illustrated is a cross-sectional view of the partially completed transistor device 200 illustrated in FIG. 3 after formation of lightly doped source/drain implants 410 within the substrate 310. The lightly doped source/drain implants 410 are conventionally formed and generally have a peak dopant concentration ranging from about 1E19 atoms/cm$^3$ to about 2E20 atoms/cm$^3$. As is standard in the industry, the lightly doped source/drain implants 410 have a dopant type opposite to that of the well region 230 they are located within. Accordingly, the lightly doped source/drain implants 410 are doped with a P-type dopant in the illustrative embodiment shown in FIG. 4.

Figure 5:
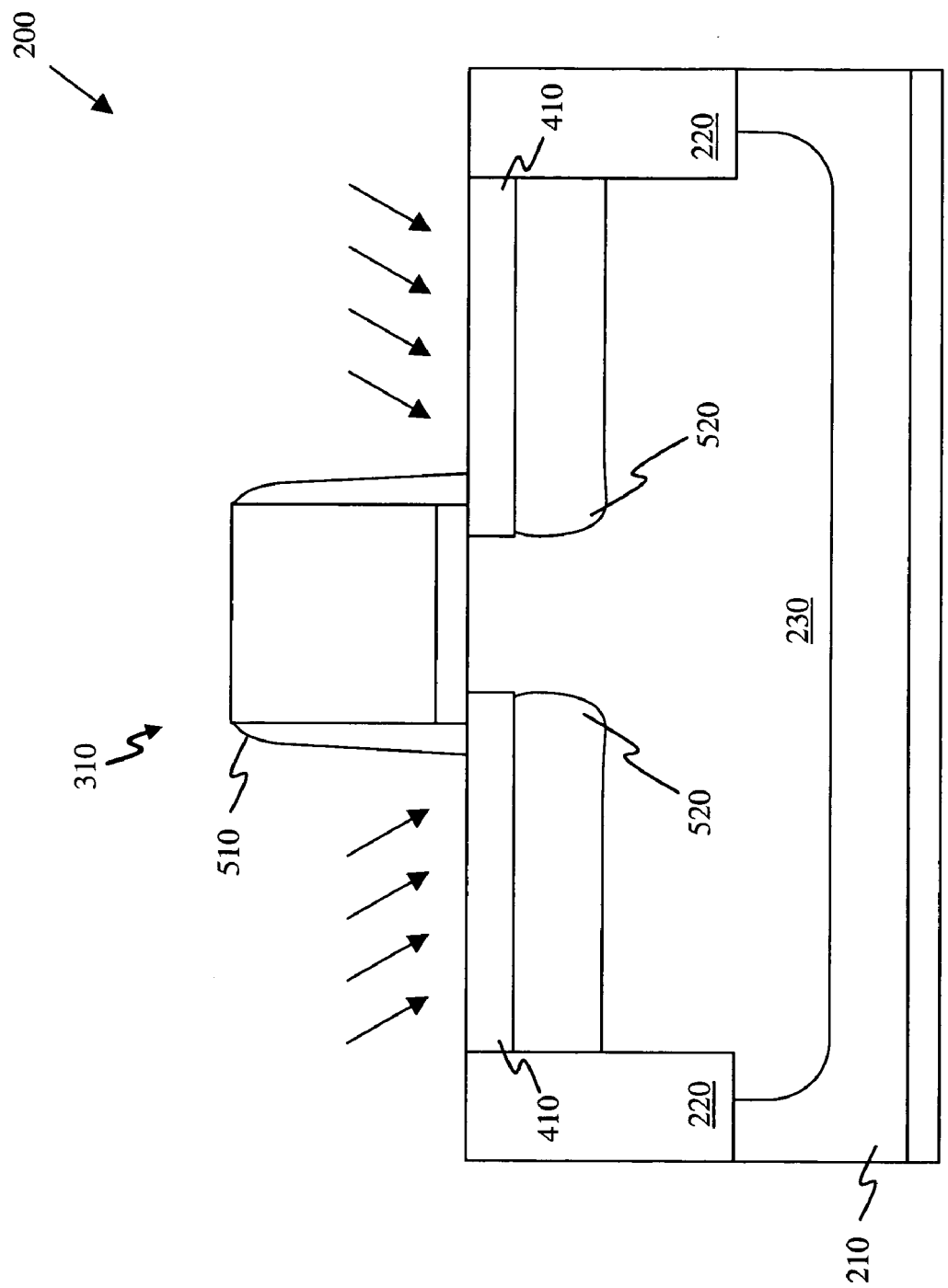
FIG. 5 illustrates a cross-sectional view of the partially completed transistor device illustrated in FIG. 4 after formation of conventional gate sidewall spacers and after placing halo implants within the substrate.

Turning now to FIG. 5, illustrated is a cross-sectional view of the partially completed transistor device 200 illustrated in FIG. 4 after formation of conventional gate sidewall spacers 510 and after placing halo implants 520 within the substrate 210. The formation of the gate sidewall spacers 510, such as Hdd offset spacers, is conventional. Often the gate sidewall spacers 510 comprise a chemical vapor deposition (CVD) oxide material that has been anisotropically etched.

The halo implants 520, in the particular embodiment discussed herein, comprise an N-type dopant. For example, in the illustrative embodiment shown in FIG. 5, the halo implants 520 include a phosphorous or arsenic dopant and have a peak dopant concentration ranging from about 1E18 atoms/cm$^3$ to about 1E19 atoms/cm$^3$. While the particular dopant used and dopant concentration of the halo implants 520 have been given, those skilled in the art understand that the present invention should not be limited to such dopants and concentrations. The use and location of the halo implants 520 is particularly designed to reduce short channel effects in the transistor device 200.

Figure 6A:
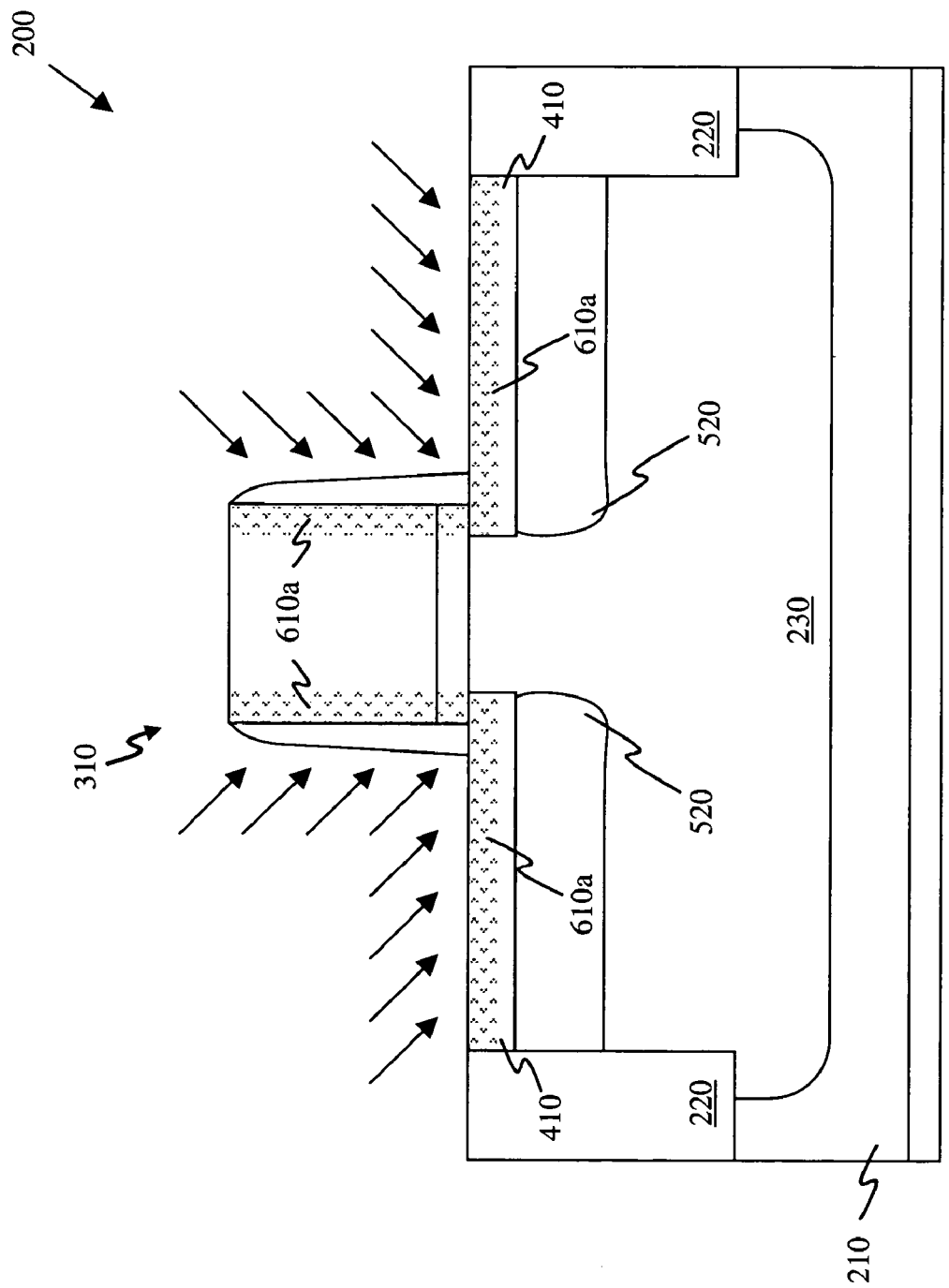
FIG. 6A illustrates a cross-sectional view of the partially completed transistor device illustrated in FIG. 5 after implanting germanium into the sidewalls of the polysilicon gate electrode, thereby forming germanium implant regions.

Turning now to FIG. 6A, illustrated is a cross-sectional view of the partially completed transistor device 200 illustrated in FIG. 5 after implanting germanium into the sidewalls of the polysilicon gate electrode 330, thereby forming germanium implant regions 610a. As is illustrated in the embodiment of FIG. 6A, the germanium implant regions 610a may also be located in an upper region of the lightly doped source/drain regions 410. Similarly, the germanium implant regions may extend into the sidewalls of the gate oxide 320.

The specifics of the germanium implant regions 610a may vary greatly depending on the intended use of the partially completed transistor device 200. Nonetheless, it is believed that in certain embodiments the thickness of the germanium implant regions 610a is substantially governed by the overlap of the polysilicon gate electrode 330 over the lightly doped source/drain regions 410. In other words, if the lightly doped source/drain regions 410 were to extend under the polysilicon gate electrode 330 by, for example 7 nm each, the thickness of the germanium implant regions 610a should be less than 7 nm. This generally holds true regardless of the scenario. That said, it is typically preferred that the thickness of the germanium implant regions 610a range from about 2 nm to about 15 nm. Similarly, it is believed that the germanium implant regions 610a should have dopant concentrations ranging from about 2E21 atoms/cm$^3$ to about 8E21 atoms/cm$^3$.

As is indicated in FIG. 6A, the germanium implant regions 610 may be introduced into the polysilicon gate electrode 330 sidewalls at an angle abnormal to the substrate 210. For example, it has been discovered that an angle of greater than about 30 degrees is required to introduce the requisite amount of germanium into the polysilicon gate electrode 330. Further, it is believed that an angle ranging from about 40 degrees to about 60 degrees works exceptionally well. Ideally, a next generation implanting tool (such as a PLAD which might be purchased from Varian Semiconductor Equipment having a principal place of business at 35 Dory Road, Gloucester, Mass. 01930), which is capable of providing conformal depositions (e.g., 90 degree implant to all surfaces), would be very suitable for the current application.

The germanium dose used to form the germanium implant regions 610a should typically range from about 4E15 atoms/cm$^2$ to about 2E16 atoms/cm$^2$. Often, the upper limit is only governed by manufacturing practicality, while the lower limit is governed by having a peak germanium concentration in the poly of preferably no less than about 2E21 atoms/cm$^3$. The implant energy used to form the germanium implant regions 610a may vary depending on their thickness, peak germanium concentration, and the surface dielectric thickness, however, the implant energy is likely to be between about 3 keV and about 10 keV.

Figure 6B:
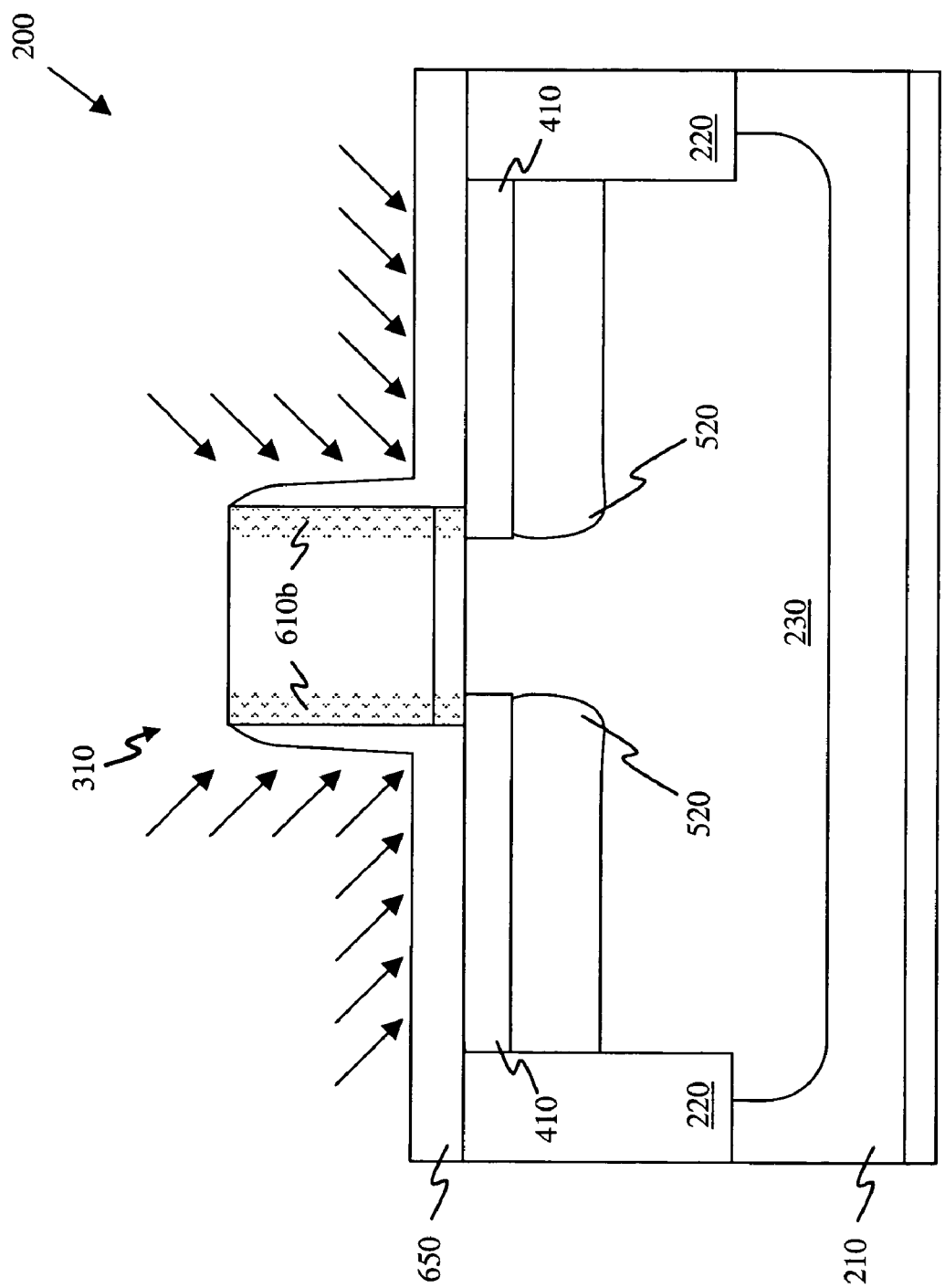
FIG. 6B illustrates a cross-sectional view of an alternative embodiment of the partially completed transistor device illustrated in FIG. 5 after introducing germanium implant regions only into the sidewalls of the polysilicon gate electrode and gate oxide.

Turning now to FIG. 6B, illustrated is a cross-sectional view of an alternative embodiment of the partially completed transistor device 200 illustrated in FIG. 5 after introducing germanium implant regions 610b only into the sidewalls of the polysilicon gate electrode 330 and gate oxide 320. Accordingly, in direct contrast to the embodiment discussed with respect to FIG. 6A, the germanium implant regions 610b are not located in the upper portions of the lightly doped source/drain regions 410.

The germanium implant regions 610b may be excluded from the upper portions of the lightly doped source/drain regions 410 by making a few minor changes to the original manufacturing process. Nonetheless, the easiest change might include swapping the chemical vapor deposition (CVD) process used to form the gate sidewall spacer 510 in FIG. 5 with a physical vapor deposition (PVD) process. Specifically, a directional PVD process would work well. What results is a blanket oxide 650 formed over the sidewalls of the polysilicon gate electrode 330 as well as the exposed substrate 210. As the blanket oxide 650 is thicker at the exposed substrate 210 than at the sidewall of the polysilicon gate electrode 330, the germanium is still able to penetrate the thinner portion and thereby form the germanium implanted regions 610b. Thereafter, an anisotropic etch could be used to remove the portions of the blanket oxide 650 from the exposed substrate 210.

Figure 7:
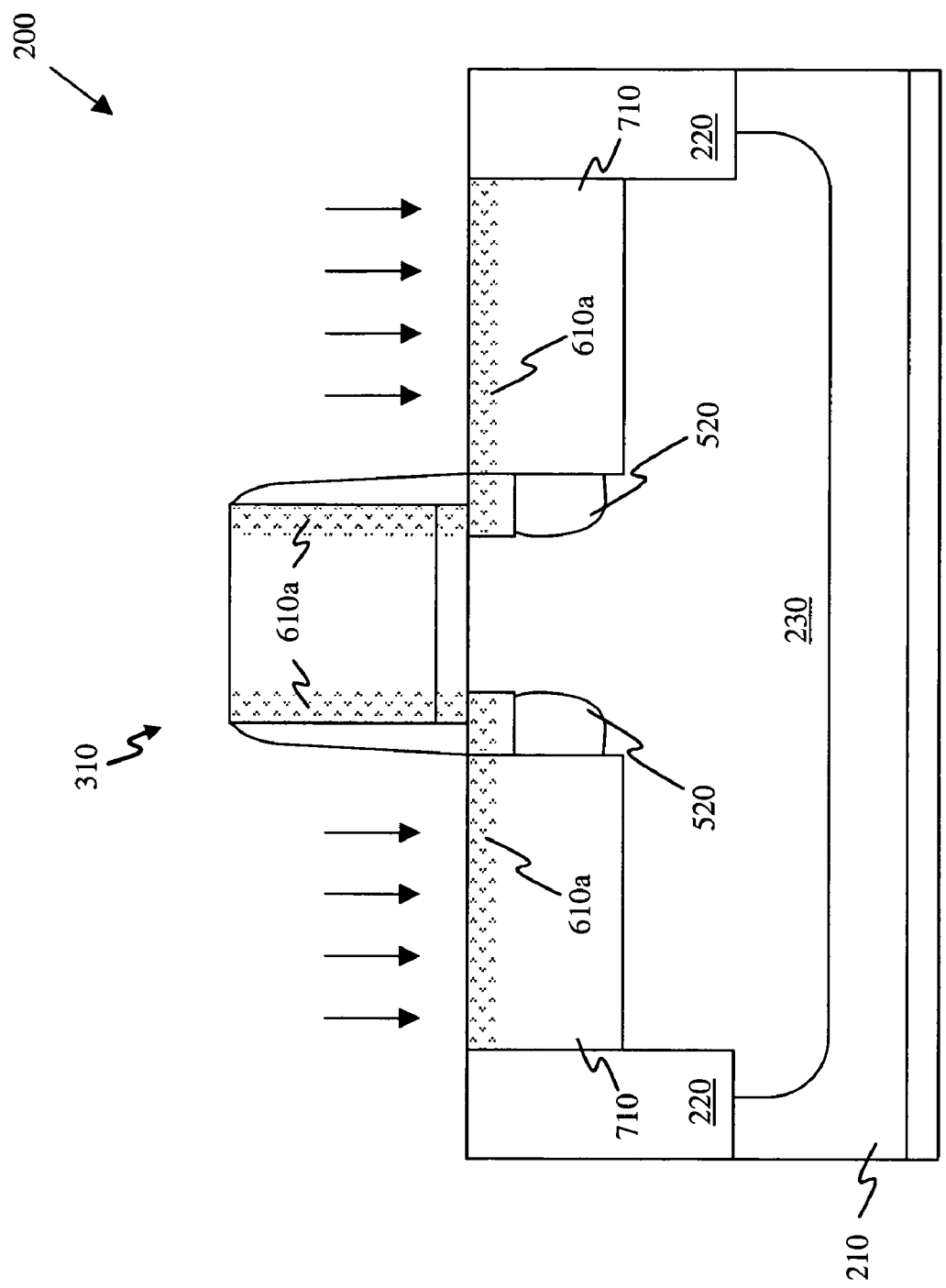
FIG. 7 illustrates a cross-sectional view of the partially completed transistor device illustrated in FIG. 6A after formation of highly doped source/drain implants within the substrate.

Turning now to FIG. 7, illustrated is a cross-sectional view of the partially completed transistor device 200 illustrated in FIG. 6A after formation of highly doped source/drain implants 710 within the substrate 210. The highly doped source/drain implants 710 are conventionally formed and generally have a peak dopant concentration ranging from about 1E18 atoms/cm$^3$ to about 1E21 atoms/cm$^3$. Also, the highly doped source/drain implants 710 should typically have a dopant type opposite to that of the well region 230 they are located within. Accordingly, in the illustrative embodiment shown in FIG. 7, the highly doped source/drain implants 710 are doped with a P-type dopant. What results after formation of the highly doped source/drain implants 710 is a device similar to the transistor device 100 illustrated in FIG. 1.

Figure 8:
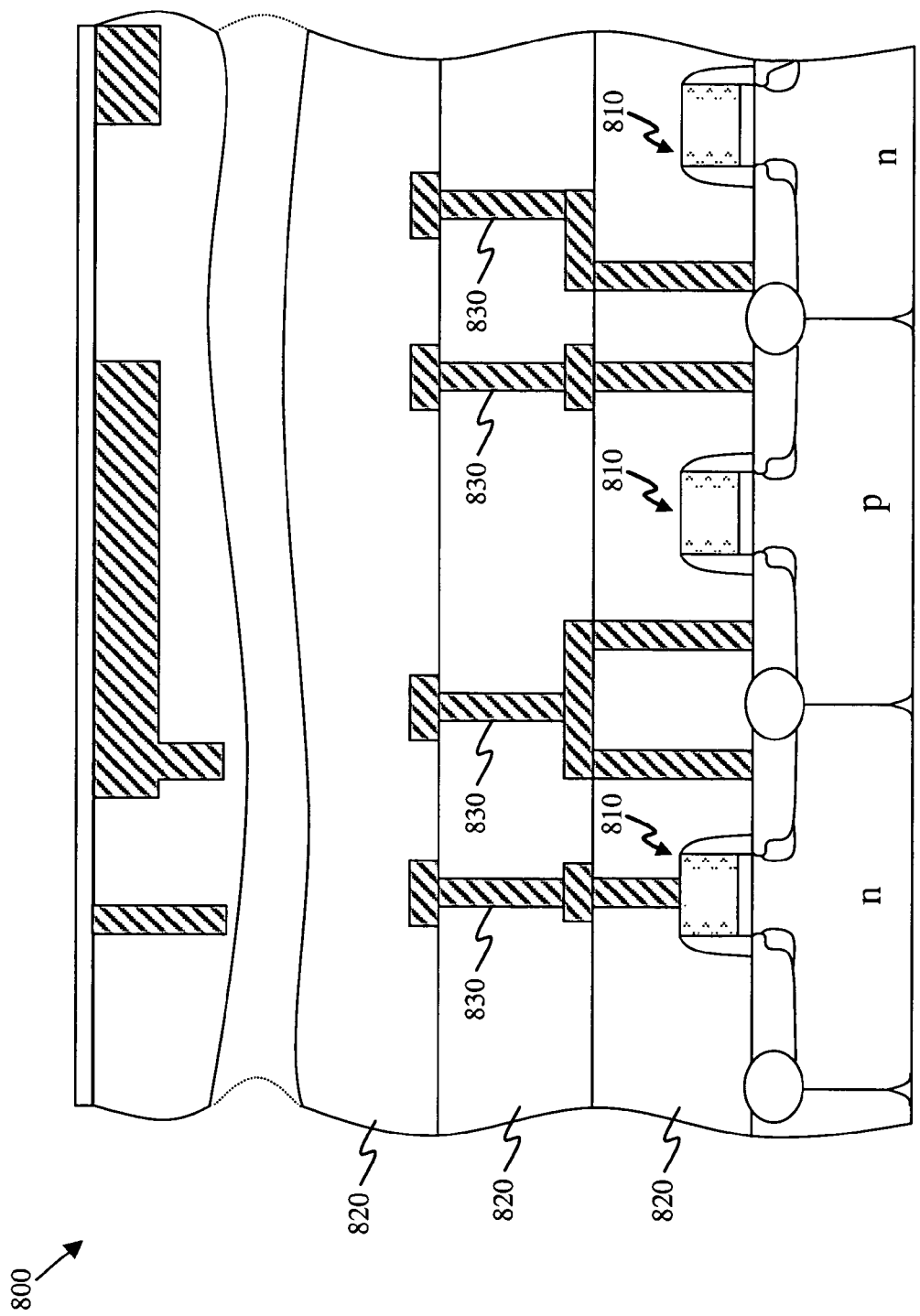
FIG. 8 illustrates a cross-sectional view of a conventional integrated circuit (IC) incorporating transistor devices constructed according to the principles of the present invention.

Referring finally to FIG. 8, illustrated is a cross-sectional view of a conventional integrated circuit (IC) 800 incorporating transistor devices 810 constructed according to the principles of the present invention. The IC 800 may include devices, such as transistors used to form CMOS devices, BiCMOS devices, Bipolar devices, or other types of devices. The IC 800 may further include passive devices, such as inductors or resistors, or it may also include optical devices or optoelectronic devices. Those skilled in the art are familiar with these various types of devices and their manufacture. In the particular embodiment illustrated in FIG. 8, the IC 800 includes the transistor devices 810 having dielectric layers 820 located thereover. Additionally, interconnect structures 830 are located within the dielectric layers 820 to interconnect various devices, thus, forming the operational integrated circuit 800.

Although the present invention has been described in detail, those skilled in the art should understand that they can make various changes, substitutions and alterations herein without departing from the spirit and scope of the invention in its broadest form.

What is claimed is:

1. A method for manufacturing a transistor, comprising:
    forming a polysilicon gate electrode over a semiconductor substrate;
    implanting a sidewall of said polysilicon gate electrode with germanium, thereby forming a germanium implanted region; and
    placing source/drain regions within said semiconductor substrate proximate said polysilicon gate electrode before said implanting, said source/drain regions including lightly doped source/drain portions that extend under said polysilicon gate electrode by a distance X, wherein said germanium implanted region has a thickness of less than X.

2. The method as recited in claim 1 further including implanting a P-type dopant within said polysilicon gate electrode, wherein said germanium implanted region has a germanium concentration sufficient to cause said P-type dopant to accumulate around said sidewall.

3. The method as recited in claim 1 wherein implanting a sidewall includes implanting two sidewalls of said polysilicon gate electrode with germanium, thereby forming first and second germanium implanted regions on opposing sidewalls of said polysilicon gate electrode.

4. The method as recited in claim 1 wherein the thickness ranges from about 2 nm to about 15 nm.

5. The method as recited in claim 1 further including implanting an upper region of said source/drain regions with germanium, thereby causing said germanium implanted region to be located within said source/drain regions.

6. The method as recited in claim 1 wherein said germanium implanted region has a dopant concentration ranging from about 2E21 atoms/cm$^3$ to about 8E21 atoms/cm$^3$.

7. A method for manufacturing a transistor, comprising:
    forming a polysilicon gate electrode over a semiconductor substrate;
    implanting lightly doped source/drain portions in said semiconductor substrate to a first depth;
    implanting a sidewall of said polysilicon gate electrode with germanium after said implanting lightly doped source/drain portions, to a second depth, forming a germanium implanted region wherein said second depth is less than said first depth; and
    placing source/drain regions within said semiconductor substrate proximate said polysilicon gate electrode.

8. The method as recited in claim 7 wherein implanting a sidewall includes implanting two sidewalls of said polysilicon gate electrode with germanium, thereby forming first and second germanium implanted regions on opposing sidewalls of said polysilicon gate electrode.

9. The method as recited in claim 7 wherein said second thickness ranges from about 2 nm to about 15 nm.

10. The method as recited in claim 7 further including implanting a P-type dopant within said polysilicon gate electrode, wherein said germanium implanted region causes said P-type dopant to accumulate around said sidewall.

11. The method as recited in claim 7 further including implanting an upper region of said source/drain regions with germanium, thereby causing said germanium implanted region to be located within said source/drain regions.

12. The method as recited in claim 7 wherein said germanium implanted region has a dopant concentration ranging from about 2E21 atoms/cm$^3$ to about 8E21 atoms/cm$^3$.

* * * * *

UNITED STATES PATENT AND TRADEMARK OFFICE
CERTIFICATE OF CORRECTION

PATENT NO.       : 7,118,979 B2                                    Page 1 of 1
APPLICATION NO.  : 10/701818
DATED            : October 10, 2006
INVENTOR(S)      : Liu et al.

It is certified that error appears in the above-identified patent and that said Letters Patent is hereby corrected as shown below:

On the title page (75) change "Mansoorz" to --Mansoori--.

Signed and Sealed this

Tenth Day of April, 2007

JON W. DUDAS
*Director of the United States Patent and Trademark Office*